United States Patent
Or et al.

(10) Patent No.: US 7,910,853 B2
(45) Date of Patent: Mar. 22, 2011

(54) DIRECT REAL-TIME MONITORING AND FEEDBACK CONTROL OF RF PLASMA OUTPUT FOR WAFER PROCESSING

(75) Inventors: David T. Or, Santa Clara, CA (US); Yu Chang, San Jose, CA (US); William Kuang, San Francisco, CA (US); Joel M. Huston, San Jose, CA (US); Chien-Teh Kao, Sunnyvale, CA (US); Mei Chang, Saratoga, CA (US)

(73) Assignee: Applied Materials, Inc, Santa Clara, CA (US)

( * ) Notice: Subject to any disclaimer, the term of this patent is extended or adjusted under 35 U.S.C. 154(b) by 346 days.

(21) Appl. No.: 12/039,514

(22) Filed: Feb. 28, 2008

(65) Prior Publication Data
US 2009/0218324 A1    Sep. 3, 2009

(51) Int. Cl.
*B23K 10/00* (2006.01)
(52) U.S. Cl. ........... 219/121.54; 219/121.43; 118/723 I; 156/345.28
(58) Field of Classification Search ............... 219/121.4, 219/121.41, 121.43, 121.44, 121.54; 156/345.24, 156/345.28, 345.48; 118/723 I
See application file for complete search history.

(56) References Cited

U.S. PATENT DOCUMENTS

| | | | |
|---|---|---|---|
| 3,718,852 A * | 2/1973 | Bailey | 363/80 |
| 6,060,837 A * | 5/2000 | Richardson et al. | 315/111.51 |
| 6,252,354 B1 * | 6/2001 | Collins et al. | 315/111.51 |
| 6,563,076 B1 * | 5/2003 | Benjamin et al. | 219/121.54 |
| 6,579,253 B1 | 6/2003 | Burbank et al. | |
| 6,887,339 B1 * | 5/2005 | Goodman et al. | 156/345.28 |
| 6,972,079 B2 | 12/2005 | Seymour et al. | |
| 7,184,134 B2 | 2/2007 | Samukawa et al. | |
| 2006/0037701 A1 | 2/2006 | Koshiishi et al. | |
| 2006/0049036 A1 | 3/2006 | Chang et al. | |
| 2007/0215282 A1 * | 9/2007 | Itabashi et al. | 156/345.33 |
| 2009/0255800 A1 * | 10/2009 | Koshimizu | 204/164 |
| 2009/0288772 A1 * | 11/2009 | Holber et al. | 156/345.1 |

FOREIGN PATENT DOCUMENTS
WO   WO-2006107044   10/2006

* cited by examiner

*Primary Examiner* — Mark H Paschall
(74) *Attorney, Agent, or Firm* — Patterson & Sheridan, LLP

(57) ABSTRACT

A method and apparatus for controlling power output of a capacitatively-coupled plasma are provided. A detector is disposed on the power delivery conduit carrying power to one electrode to detect fluctuations in power output to the electrode. The detector is coupled to a signal generator, which converts the RF input signal to a constant control signal. A controller adjusts power input to the RF generator by comparing the control signal to a reference.

12 Claims, 3 Drawing Sheets

DIRECT REAL-TIME MONITORING AND FEEDBACK CONTROL OF RF PLASMA OUTPUT FOR WAFER PROCESSING

BACKGROUND OF THE INVENTION

1. Field of the Invention

Embodiments of the present invention generally relate to a method and apparatus for manufacturing semiconductors, and more particularly to a method and apparatus for controlling the power output of a plasma source.

2. Description of the Related Art

Plasma processing is common in the semiconductor manufacturing industry. Plasma conditions are used to deposit, etch, clean, and dope substrates because ionized gases are more reactive, and thus create the materials needed for the applications more readily. In some applications, two electrodes are disposed adjacent to the reaction space so that an electric field may be generated therein. The electrodes act like a capacitor, and the electric field dissociates electrons from atoms and molecules between the electrodes. The resulting activated species react more readily than the stable electronically complete species. In other applications, a strong magnetic field may be used to generate the plasma. A gas may be forced through a tube around which an inductive coil is disposed. Current passing through the coil generates a strong magnetic field, and electrons bound to molecules moving through the field are energized to dissociate from those molecules. Alternately, the inductive coil may be disposed around a torroidal permanent magnet, which is itself disposed around the tube, to generate an inductively-coupled electric field inside the tube.

In a capacitatively-coupled plasma, the electric field is generated by charge separation between the two electrodes. In most cases, the charge separation is powered by an applied potential that oscillates at radio frequency. The substrate upon which species are to be deposited is placed on one of the electrodes. As charged species deposit on the surface, current flows, so power must be applied to maintain the charge separation. The amount of power that must be applied from moment to moment changes as the rate of deposition fluctuates. In most conventional capacitative applications, however, the power supply powering the electrode is not adjusted after it is initially set. When multiple deposition chambers are used, deposition rates and qualities among the chambers vary. Individual power supplies may also drift in the power they produce. Moreover, because plasmas are gases of charged particles, they can be unstable. A way is therefore needed to monitor and control rates of deposition in individual chambers directly in real-time.

SUMMARY OF THE INVENTION

Embodiments of the present invention generally provide an apparatus for controlling the RF power output of a plasma source, comprising at least one detector coupled to a power delivery conduit, wherein the power delivery conduit is configured to deliver RF power from a power supply to an electrode for generating the plasma, a signal generator configured to convert an oscillating electrical signal from the detector into a controlled signal, and a controller configured to control the power supply based on the controlled signal.

Embodiments of the present invention also provide an apparatus for creating a plasma in a process chamber, comprising one or more electrodes, an RF generator coupled to at least one of the electrodes by a power delivery conduit, a power supply for the RF generator, a monitoring circuit coupled to the power delivery conduit, a signal generator coupled to the monitoring circuit, and a controller coupled to the signal generator and the power supply.

Embodiments of the present invention also provide a method of controlling the RF power output of a plasma source, comprising generating a raw signal from the RF power delivered to the electrode generating the plasma using a detection circuit, converting the raw signal into a controlled signal using a signal generator, comparing the controlled signal to a set point using a controller, and adjusting the amplitude of the RF power output based on the controlled signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention provides a method and apparatus for monitoring and controlling deposition in a plasma chamber in real-time. In one embodiment, the root-mean-square current provided to the plasma electrode is monitored, converted to a signal, and compared to a set point. Deviation from a target value is then controlled by adjusting power input to the plasma.

Figure 1:
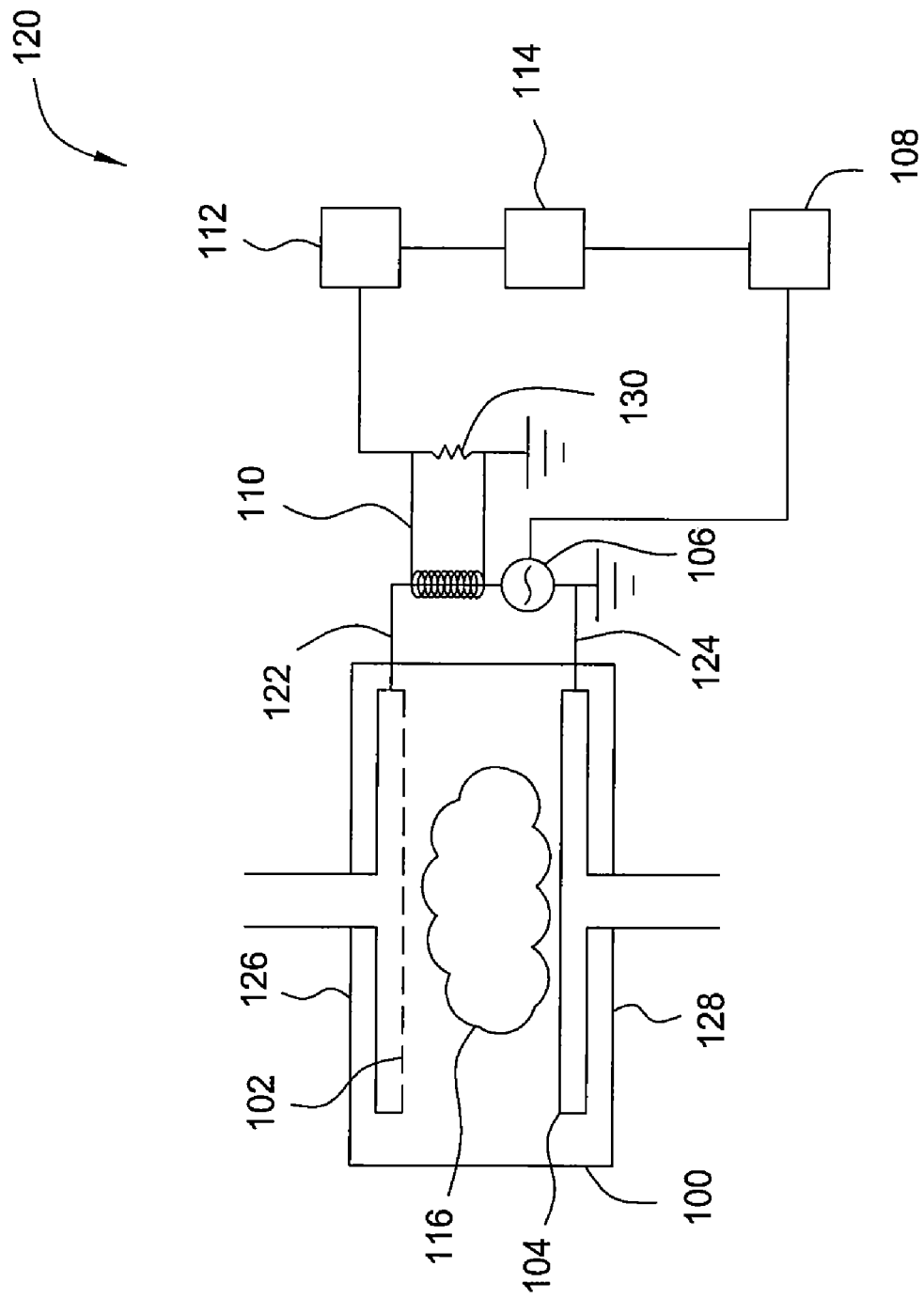
FIG. 1 is a schematic cross-section diagram of an apparatus according to one embodiment of the invention.

FIG. 1 is a schematic cross-section diagram of a capacitatively-coupled plasma chamber 100. In many embodiments, chamber 100 has a gas distribution manifold 102, which may be a showerhead, and a substrate support 104. Gas distribution manifold 102 and substrate support 104 may each be heated or cooled as needed by resistive means or by providing a thermal control medium to channels formed in either. A substrate may be supported on the substrate support by electromagnetic forces, by vacuum, or by physical clamping. A substrate held in place by electromagnetic forces may be made to float on a layer of non-reactive gas provided through holes in the substrate support to the side of the substrate nearest the support.

In one embodiment, a plasma generation circuit 120 is shown coupled to chamber 100 by power delivery conduits 122 and 124. Plasma generation circuit 120 is configured to generate plasma 116 between a substrate support 104 and a gas distribution manifold 102. Power delivery conduit 122 is shown coupled to the gas distribution manifold 102, but it may be coupled to a lid 126 of chamber 100 in alternate embodiments. Power delivery conduit 124 is shown coupled to substrate support 104, but it may be coupled to chamber body or floor 128 in alternate embodiments. In still other embodiments, an additional plate (not shown) may be included in chamber 100 to serve as an electrode for coupling to either power delivery conduit 122 or power delivery conduit 124.

In one embodiment, RF generator 106 is shown coupled to gas distribution manifold 102 by power delivery conduit 122, and substrate support 104 is grounded by power delivery conduit 124. Gas distribution manifold 102 thus functions as an electrode for a capacitatively-coupled plasma generator. In this embodiment, power delivery conduit 122 delivers RF power from generator 106 to gas distribution manifold 102, which is an electrode in some embodiments. Power is supplied to RF generator 106 by power supply 108, which may be an electronic ballast. RF generator 106 generates an alternating electric potential on gas distribution manifold 102, which generates an oscillating electric field between gas distribution manifold 102 and substrate support 104, creating plasma 116. In alternate embodiments, RF power may be coupled to substrate support 104 or chamber body 128 by power delivery conduit 124, or to chamber lid 126 by power delivery conduit 122. In still other embodiments, RF power may be coupled by either conduit to an additional plate (not shown) provided to serve as an electrode.

In one embodiment, RF generator 106, powered by power supply 108, provides a net electrical current to plasma chamber 100 as charged species deposit on a substrate disposed on substrate support 104. This current may be monitored by a monitoring circuit 110 disposed to monitor power supplied to chamber 100 by RF generator 106. In some embodiments, monitoring circuit 110 is a power detector. In one embodiment, monitoring circuit 110 is a conductive coil. In another embodiment, monitoring circuit 110 may be a transformer. In another embodiment, monitoring circuit 110 may be a potentiometer. Monitoring circuit 110 detects the power being applied through power delivery conduit 122 to chamber 100, and registers this as a raw oscillating signal. It is desirable that monitoring circuit 110 detects power flowing through power delivery conduit 122 with an error rate of about 0.5% or less, and preferably about 0.1% or less.

In one embodiment, the oscillating signal is provided to a signal generator 112, which converts the oscillating signal from the monitoring circuit 110 to a constant controlled signal representing the root-mean-square power flowing through power delivery conduit 122. In one embodiment, signal generator 112 comprises an AC to DC converter and an amplifier. The AC to DC converter may be any type designed to yield approximately constant output voltage or current from alternating voltage or current, such as a rectifier. Such a device may be transistor-based, thyristor-based, or component-based (e.g. diode-based), and may further comprise filter circuits to smooth the rectified signal. In some embodiments, the AC to DC converter may be an RMS to DC converter. The amplifier may be any device designed to increase the voltage or current of an input signal by a predictable amount, such as an operational amplifier.

The signal output from signal generator 112 may be provided to controller 114. The signal is compared to a reference signal, which may be a set point, to determine whether power input to RF generator 106 needs adjusting. Power supply 108 may be configured to adjust power input to RF generator 106 by adjusting amplitude or frequency of the voltage signal. In alternate embodiments, signal generator 112 may be integrated with controller 114, or both may be integrated with power supply 108. In still other embodiments, one controller 114 or power supply 108, or both, may be used to control multiple plasma generators through hierarchical control mechanisms and power distribution networks. Further embodiments may provide multiple power supplies networked to provide power to one or more plasma chambers.

In one embodiment, monitoring circuit 110 comprises a current transformer with a step-down ratio of about 200:1 disposed around power delivery conduit 122. A small current, such as about 1 milliampere (mA) is generated by the detection circuit to avoid leaking power from the plasma generator. For example, in one embodiment, the detection circuit may take 0.5 watts of power, or less, from the RF power delivery conduit 122. A relatively large shunt resistor 130, such as about 1 kiloohm (kΩ), results in a potential of about 1 volt (V) on a root-mean-square basis. Signal generator 112 will preferably generate a DC voltage from the AC input, with an error rate less than about 0.1%. An RMS to DC converter, such as an AD536 or AD636 converter, available from Analog Devices, Inc., of Norwood, Mass., may be used as a signal generator for some embodiments. Finally, a non-inverting operational amplifier of suitable gain, such as about 6, is preferably used to amplify the DC signal without sizeable loss of accuracy. A detecting and signal processing circuit of high accuracy is preferred for applications seeking to control power output of a plasma chamber. In order to preserve this accuracy, it may be preferable to limit the frequency of the applied power to about 400 kHz or less, such as about 200 kHz. In this way, total accuracy of the control circuit may be maintained at an error rate of about 0.3% or less.

Although no impedance matching network is shown in the embodiment of FIG. 1, an impedance matching network may be used if desired. Impedance matching is generally advantageous in high-power plasma systems because power losses can be high. The embodiment illustrated in FIG. 1 is configured to operate at lower power ratings, such as less than 200 watts, where impedance losses will be negligible, so no matching network is shown.

Figure 2:
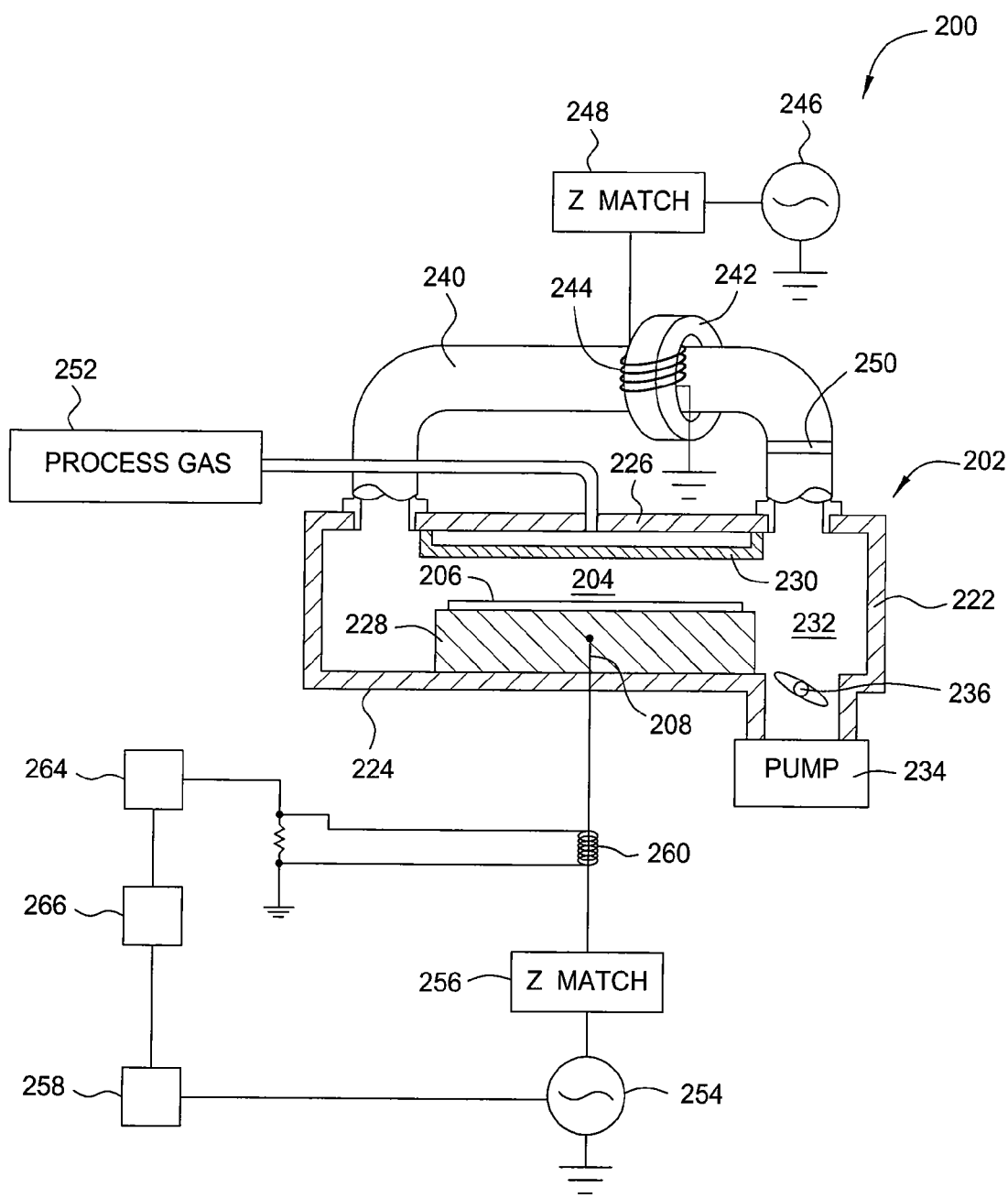
FIG. 2 is a cross-section diagram of an apparatus according to another embodiment of the invention.

FIG. 2 is a cross-section diagram according to another embodiment of the invention. A process chamber 202 is configured with an inductively coupled plasma generation apparatus 200. The process chamber 202 is shown with RF generator 246 coupled to magnetic core 242 through matching network 248 and coil 244. The inductive unit formed by coil 244 and core 242 dissociates molecules in tube 240, which flow into reaction space 204. Isolator 250 in the tube 240 maintains electrical integrity of the plasma. Process gas is introduced into process chamber 202 from source 252 through lid 226 and distributor 230. Gas is evacuated from process chamber 202 by vacuum pump 234 through passage 232 and valve 236 between wall 222 and substrate support 228, passing through floor 224. An electrical bias is applied to substrate support 228 in this embodiment by coupling RF generator 254 to substrate support 228 through matching network 256. Substrate support 228 thus acts as an electrode for a capacitatively-coupled plasma generator. The electrical bias applied to the substrate support 228 encourages reaction of process gases with a substrate 206 disposed on the substrate support 228. RF generator 254 is powered by power supply 258, which may be an electronic ballast.

Power output to the substrate support 228 may fluctuate in this embodiment due to fluctuations in strength of the plasma as more or less ionization takes place, or drift in the power output of power supply 258. Such fluctuations and drift affect the performance of processes that depend on consistency of the bias applied to the substrate support 228, particularly from chamber to chamber. A monitoring circuit 260 is provided to detect the power output to the plasma chamber. In some embodiments, monitoring circuit 260 is a power detector. Circuit 260, which may be a monitoring circuit, a conductive coil, or a potentiometer, detects the oscillating RF voltage or current passing through power delivery conduit 208 to the substrate support 228. Resistor 262 generates an input voltage signal for signal generator 264, which generates a control signal by converting the oscillating input voltage signal into a DC signal. The control signal from signal generator 264 is passed to controller 266, which adjusts power output of power supply 258, which may be an electronic ballast, by comparing the control signal to a reference. Signal generator 264 may comprise an AC to DC converter, such as a rectifier or RMS to DC converter, and an amplifier, which may be an operational amplifier.

Figure 3:
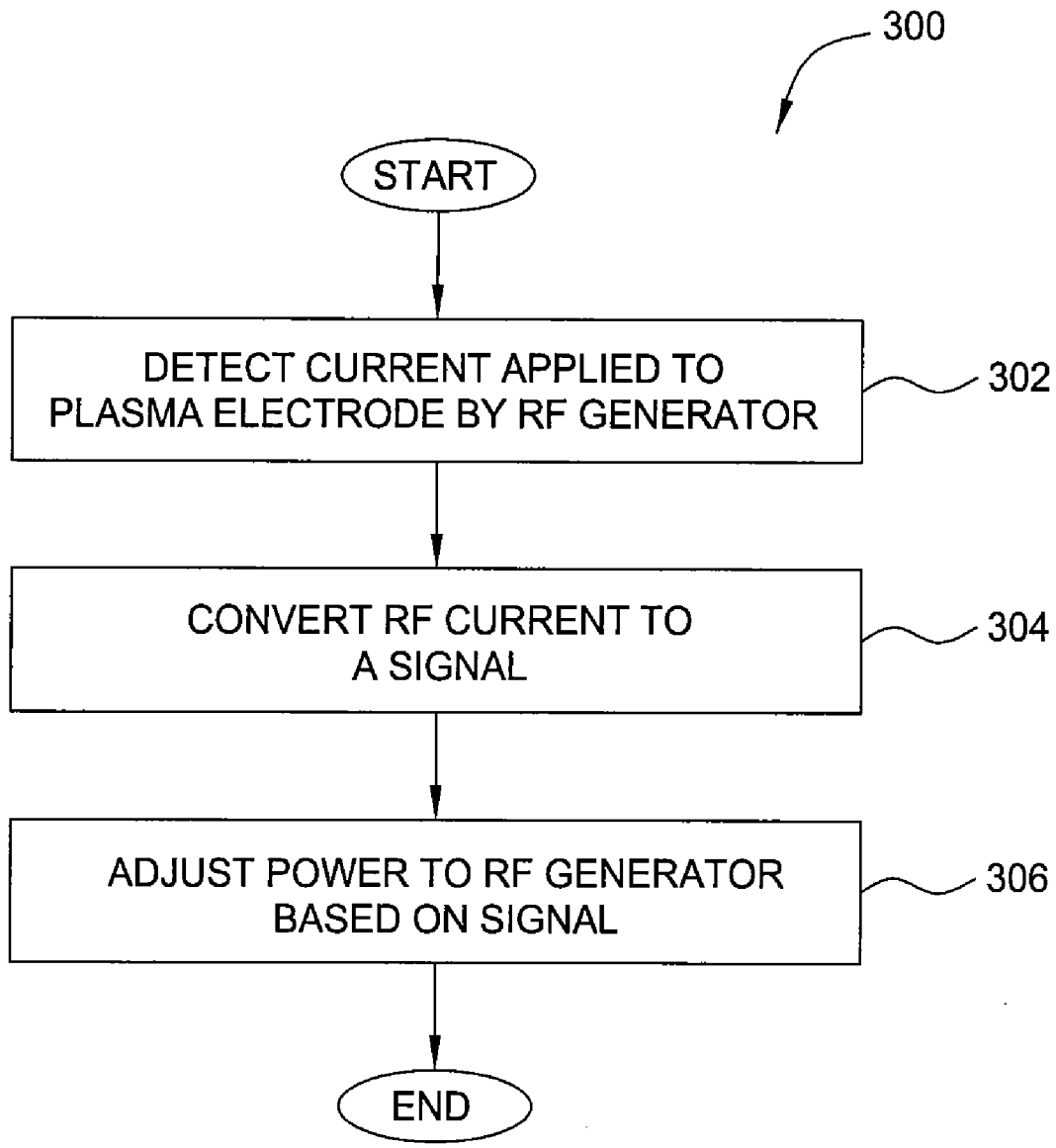
FIG. 3 is a process flow diagram according to another embodiment of the invention.

Embodiments of the invention also provide a method for controlling the power output of a plasma in real-time. FIG. 3 is a process flow diagram illustrating a method 300 according to one embodiment of the invention. In order to control the power output of a plasma generated between two electrodes in a chamber, the power applied to one of the electrodes may be monitored in any convenient manner in step 302. For example, it may suffice to use a detection circuit to generate a raw signal from the current passed to the electrode. In one embodiment, a conductive coil wrapped around a torroidal permanent magnet may be disposed around the power delivery conduit carrying current to the electrode. In another embodiment, it may suffice to detect the electric potential applied to the electrode using a potentiometer. The means used to detect the power passing to the electrode will preferably be highly accurate, with an error rate less than about 0.1%, to minimize errors in the control signal.

The raw signal generated by the detector may be converted into a controlled signal in step 304. In many plasma applications, the power applied to the electrode oscillates at a frequency that falls within the radio spectrum, or lower. The frequency may be less than about 400 kHz in some embodiments, such as less than about 200 kHz. The detected power signal may be converted into a controlled signal using any convenient means, such as a signal generator. It is preferable that the conversion be highly accurate for control applications, with an error rate less than about 0.1%. In embodiments wherein the power input to the plasma oscillates, the raw signal must be converted from an AC signal to a DC signal. In some embodiments, a rectifier or AC to DC converter may be used, while in other embodiments an RMS to DC converter, such as the AD536 or AD636 converter available from Analog Devices, Inc., of Norwood, Mass., may be used. The controlled signal may be provided to a controller, which compares the controlled signal to a reference and adjusts the power input to the plasma. The controller adjusts power to the RF generator based on the signal in step 306. If the power is provided by a power supply coupled to an RF generator, for example, the controller may adjust the amplitude or the frequency of the power. If the power supply is an electronic ballast, the controller may adjust the electronic ballast to modulate the power input to the RF generator based on the controlled signal.

While the foregoing is directed to embodiments of the present invention, other and further embodiments of the invention may be devised without departing from the basic scope thereof, and the scope thereof is determined by the claims that follow.

The invention claimed is:

1. An apparatus for controlling the RF power output of a plasma source, comprising:
    at least one detector coupled to a power delivery conduit, wherein the power delivery conduit is coupled to an RF power supply and an electrode for generating a low power plasma;
    a signal generator coupled to the detector and configured to convert an oscillating electrical signal from the detector into a controlled signal; and
    a controller coupled to the signal generator and the power supply, and configured to adjust the power supply based on the controlled signal, wherein the power supply is an electronic ballast.

2. The apparatus of claim 1, wherein the detector is a conductive coil.

3. The apparatus of claim 1, wherein the detector detects the plasma current with an error rate of 0.5% or less.

4. The apparatus of claim 1, wherein the signal generator comprises an RMS to DC converter.

5. The apparatus of claim 1, wherein the power supply adjusts the amplitude of the RF power based on the controlled signal.

6. An apparatus for creating a plasma in a process chamber, comprising:
    one or more electrodes;
    a low frequency RF generator coupled to at least one of the electrodes by a power delivery conduit;
    a power supply coupled to the RF generator;
    a current monitoring circuit coupled to the power delivery conduit;
    a signal generator coupled to the monitoring circuit; and
    a controller coupled to the signal generator and the power supply, wherein the power supply is an electronic ballast.

7. The apparatus of claim 6, wherein the current monitoring circuit detects the plasma current.

8. The apparatus of claim 6, wherein the current monitoring circuit is a conductive coil disposed around the power delivery conduit.

9. The apparatus of claim 7, wherein the current monitoring circuit has an error rate less than 0.5%.

10. The apparatus of claim 6, wherein the power supply adjusts the amplitude of the RF power based on a signal from the controller.

11. The apparatus of claim 6, wherein the signal generator comprises an RMS to DC converter.

12. The apparatus of claim 6, wherein the signal generator converts an oscillating electrical signal into a controlled signal.

* * * * *